United States Patent
Wu et al.

(10) Patent No.: US 11,133,641 B1
(45) Date of Patent: Sep. 28, 2021

(54) TERAHERTZ LASER DEVICE BASED ON ZINC OXIDE PHONON VIBRATION OPTICALLY EXCITED AT ROOM TEMPERATURE

(71) Applicant: Nanjing University, Nanjing (CN)

(72) Inventors: Xinglong Wu, Nanjing (CN); Run Yang, Nanjing (CN); Yixian Wang, Nanjing (CN); Jiancang Shen, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 17/335,624

(22) Filed: Jun. 1, 2021

(30) Foreign Application Priority Data

Nov. 27, 2020 (CN) .......................... 202011357450.8

(51) Int. Cl.
| | |
|---|---|
| *H01S 3/30* | (2006.01) |
| *H01S 4/00* | (2006.01) |
| *H01S 3/094* | (2006.01) |
| *H01S 3/0943* | (2006.01) |
| *H01S 3/08* | (2006.01) |
| *H01S 3/091* | (2006.01) |
| *H01S 3/108* | (2006.01) |
| *H01S 5/22* | (2006.01) |

(Continued)

(52) U.S. Cl.
CPC ............ *H01S 4/00* (2013.01); *H01S 3/08077* (2013.01); *H01S 3/091* (2013.01); *H01S 3/0943* (2013.01); *H01S 3/09403* (2013.01); *H01S 3/1086* (2013.01); *G01N 21/65* (2013.01); *H01S 3/09* (2013.01); *H01S 5/042* (2013.01); *H01S 5/2214* (2013.01)

(58) Field of Classification Search
CPC .. H01S 3/08077; H01S 3/091; H01S 3/09403; H01S 3/0943; H01S 3/1086; H01S 4/00
See application file for complete search history.

(56) References Cited

U.S. PATENT DOCUMENTS 9,382,429 B2 * 7/2016 Lu ........................... C09C 1/043
9,453,774 B2 * 9/2016 Bao ......................... G01L 7/041
(Continued)

*Primary Examiner* — Kinam Park
(74) *Attorney, Agent, or Firm* — Bret E. Field; Bozicevic, Field & Francis LLP

(57) ABSTRACT

Disclosed is a terahertz laser device based on phonon vibration excitation, including a resonant cavity composed of a hollow waveguide made of a composite film and optical lenses at both ends of the waveguide, where M represents nano-metal particles. A zinc oxide mesomorphic microsphere is used herein as a source, symmetric stretching vibration of nanosheets on the zinc oxide microsphere is excited and induced by a laser and is transmitted through elastic and electric coupling among the nanosheets, and a terahertz wave with a frequency of 0.36 THz is radiated by means of phonon vibration; moreover, the zinc oxide mesomorphic microspheres and the nano-metal particles are mixed evenly to produce a strong local electric field a few nanometers nearby a surface of the metal particle by taking advantage of a surface-enhanced Raman effect of the nano-metal particles, a nanocantilever of the ZnO mesomorphic microsphere is greatly changed in polarizability with ample contact of the nano-metal particles and the ZnO mesomorphic microspheres, and thus the terahertz radiation power thereof is enhanced.

17 Claims, 2 Drawing Sheets

(51) Int. Cl.
*G01N 21/65* (2006.01)
*H01S 3/09* (2006.01)
*H01S 5/042* (2006.01)

(56) References Cited

U.S. PATENT DOCUMENTS

| | | | | |
|---|---|---|---|---|
| 2010/0098125 | A1* | 4/2010 | Bianchi | H01S 3/08 |
| | | | | 372/40 |
| 2012/0220069 | A1* | 8/2012 | Lin | C23C 18/1254 |
| | | | | 438/98 |
| 2012/0224246 | A1* | 9/2012 | Yeh | G02F 1/1533 |
| | | | | 359/265 |
| 2014/0132861 | A1* | 5/2014 | Wang | G06F 3/0446 |
| | | | | 349/12 |
| 2018/0258254 | A1* | 9/2018 | Jin | C08K 3/042 |
| 2019/0296521 | A1* | 9/2019 | Yun | H01S 5/40 |
| 2020/0321547 | A1* | 10/2020 | Wu | B82Y 30/00 |

\* cited by examiner

TERAHERTZ LASER DEVICE BASED ON ZINC OXIDE PHONON VIBRATION OPTICALLY EXCITED AT ROOM TEMPERATURE

FIELD OF THE PRESENT DISCLOSURE

The present disclosure relates to the field of terahertz laser devices, and more particularly, to a terahertz laser device that radiates terahertz waves by means of phonon vibration to realize the output of terahertz signals of a long wavelength at room temperature.

BACKGROUND OF THE PRESENT DISCLOSURE

The electromagnetic spectrum has frequencies ranging from 0.1 to 10 THz in the terahertz (THz) region, which fall between the infrared band and the microwave band. Technologies associated with infrared waves and microwaves have been well developed, but THz waves between them are incompatible with these technologies, and such incompatibility is known as THz Gap (B. Ferguson et al., Nat. Mater. 2002, 1, 26-33). However, the THz wave has strong penetrability, low energy and minimal biological damage, and can be widely used in the fields of semiconductors, medical treatment, manufacturing, the national defense industry, and the like. Therefore, the THz wave is one of the spectral regions people have paid close attention to and developed fastest in the past decades, and novel operation mechanisms and new materials have been continuously introduced into the THz technologies.

Preparation of a high-performance THz source is one of the important means to develop the THz technologies. At present, a plurality of different THz radiation sources havo has been developed and are roughly classified as two types according to pump sources. One type is optical pumping, wherein pulsed lasers or laser devices are used to generate THz radiation by taking advantage of nonlinear optical effects such as optical rectification, differential frequency generation or optical parametric oscillation. Non-linear media of interest include GaAs, GaSe, GaP, ZnTe, CdTe, LiNbO3, and the like. The method is simple in the experimental condition and easy to implement but features a low conversion efficiency, so that it is necessary to further find more effective materials remain. The other type is electrical pumping, and it generates THz radiation through the injection of electrons. The most widely used is the terahertz quantum cascade laser (THz-QCL) device, which emits THz waves through electron relaxation between quantum well sub-bands. It provides a THz signal with strong power and a high conversion efficiency by this method, which is strict with the experimental conditions such as low temperature and a high radiation frequency (higher than 1 THz). There are many other THz radiation devices than the two major types of THz sources above, for example, resonant tunneling diodes, THz plasma optical mixers and Bloch oscillators, $CO_2$ laser devices with pump gas molecules to produce THz radiation, and the like. As new materials and technologies develop quickly, more THz sources will be developed and applied.

The THz sources in the prior art are advantageous/defective in certain aspects, respectively. It is still a challenge to prepare a THz source that works at room temperature, produces high-frequency and long-wavelength radiation, and has as high power and a conversion efficiency as possible.

SUMMARY OF THE PRESENT DISCLOSURE

The present disclosure provides a terahertz laser device that radiates terahertz waves by means of phonon vibration to realize the output of terahertz signals of a long wavelength at room temperature, a corresponding resonant cavity, and a hollow waveguide.

To achieve the object of the present disclosure, the following technical solution is implemented: a terahertz laser device based on phonon vibration excitation, including a resonant cavity, wherein the resonant cavity is composed of a hollow waveguide made of an Ag/flexible support layer/ZnO-M film and optical lenses at both ends of the waveguide, where M represents nano-metal particles.

Optionally, the optical lens at an input end of the waveguide is a polymethylmethacrylate (PMMA) sheet and the optical lens at an output end is a THz bandpass filter.

Optionally, the Ag/flexible support layer/ZnO-M film comprises a ZnO mesomorphic microsphere-nano-metal particle film (abbreviated as ZnO-M film), a flexible support layer, and a nano-Ag reflection-enhancing film which are sequentially connected from inside to outside.

Optionally, the ZnO-M film is secured on the flexible support layer after the ZnO mesomorphic microspheres and the nano-metal particles are closely contacted and mixed through a binder.

Optionally, a diameter ratio of the ZnO mesogenic microsphere to the nano-metal particle is 200:1 to 600:1.

Optionally, ZnO mesomorphic microspheres have an average size of 1 to 5 μm and a surface composed of a plenty of nanosheets arranged densely and radially.

Optionally, the ZnO-M film is obtained by closely contacting and mixing the zinc oxide mesomorphic microspheres and the nano-metal particles, fully mixing with the binder, and dissolving in an organic solvent, ultrasonically oscillating to obtain a suspension, and securing the suspension on the flexible support layer by spin coating.

Optionally, PMMA is adopted as the binder, and PMMA is a mesh structure to fix the ZnO mesomorphic microspheres and the nano-metal particles on the flexible support layer.

Optionally, the nano-metal particles are metal particles rendering an excellent surface-enhanced Raman scattering effect, preferably Au, Ag, and Cu particles, more preferably, nano-Ag particles, wherein the nano-Ag particle has a size of 5 to 15 nm.

Optionally, the flexible support layer is a film with excellent flexibility, stability and dielectric properties and less loss to terahertz signals, preferably a polyimide (PI) film, which can be obtained through spin coating.

Optionally, the nano-Ag reflection-enhancing film is a relatively smooth film having good flexibility and excellent performance of reflecting electromagnetic waves, can be obtained through magnetron sputtering, and has a thickness of greater than 106 nm, preferably 191 nm.

Optionally, a length of the resonant cavity is set to be L, L=0.416n mm, where n is a positive integer, preferably 30 to 80.

Optionally, the terahertz laser device employs an argon ion laser device having a wavelength of 514.5 nm as an excitation source, and a green laser is incident into the waveguide through the optical lens at the input end of the waveguide.

Optionally, a laser is incident into the waveguide through the optical lens at the input end of the waveguide, wherein an incidence direction of the laser is at an angle of 30 degrees to a wall of the waveguide.

Specifically, in a first aspect, an embodiment of the present disclosure provides a hollow waveguide, the resonant cavity is composed of a composite film, wherein the composite film comprises a ZnO mesomorphic microsphere-nano-metal particle film layer, a flexible support layer, and a nano-Ag reflection-enhancing film layer which are sequentially connected, the ZnO mesomorphic microsphere-nano-metal particle film layer is formed by a mixture of ZnO mesomorphic microspheres and nano-metal particles.

Optionally, the ZnO mesomorphic microsphere-nano-metal particle film layer is formed by the mixture secured to the flexible support layer by the binder.

Optionally, the ZnO mesomorphic microsphere-nano-metal particle film layer is obtained by securing a suspension, which is obtainable by dissolving the mixture and the binder in an organic solvent and ultrasonically oscillating, on the flexible support layer by spin coating.

Optionally, the ZnO mesomorphic microsphere-nano-metal particle film layer is formed by the mixture of ZnO mesomorphic microspheres and nano-metal particles secured on the flexible support layer by PMMA of a mesh structure.

Optionally, an average diameter of the ZnO mesomorphic microspheres is 1 to 5 μm, and a diameter ratio of the ZnO mesomorphic microsphere to the nano-metal particle is 200:1 to 600:1.

Optionally, the ZnO mesomorphic microsphere is composed of radially distributed cantilevers, and each cantilever is composed of nanosheets.

Optionally, the nano-metal particle is a metal particle rendering a surface-enhanced Raman scattering effect.

Optionally, the nano-metal particles are one or more of nano Au particles, nano-Ag particles, and nano Cu particles, and a size of the nano-metal particle is 5 to 15 nm.

Optionally, the nano-Ag reflection-enhancing film layer has a thickness greater than 106 nm, for example, 191 nm.

In a second aspect, the present disclosure provides a resonant cavity composed of a hollow waveguide made of a composite film and optical lenses at both ends of the waveguide, wherein the hollow waveguide here may be the hollow waveguide as described in any part of the above first aspect.

Optionally, the optical lens at an input end of the waveguide is a polymethylmethacrylate sheet and the optical lens at an output end is a THz bandpass filter.

Optionally, a length of the resonant cavity is L=0.416n mm, where n is a positive integer, and n ranges from 30 to 80.

In a third aspect, the present disclosure provides a laser device including a resonant cavity, the resonant cavity herein being the resonant cavity as described in any part of the above second aspect.

Optionally, an excitation source of the terahertz laser device is an argon ion laser device using a wavelength of 514.5 nm.

Optionally, a laser emitted by the excitation source is incident into the waveguide through the optical lens at the input end of the waveguide, where an incident direction of the laser is at an angle of 30 degrees to a wall of the waveguide.

As compared with the prior art, the technical solution provided by the embodiments of the present disclosure is more advantageous in that:

1. a zinc oxide mesomorphic microsphere is used as the source, a symmetric stretching vibration of nanosheets on the zinc oxide microsphere is induced and excited by a laser, propagates through the elastic and electrical coupling among nanosheets, and radiates terahertz waves with a frequency of 0.36 THz outwards by means of phonon vibration;

2. to improve the energy conversion efficiency of the device, the zinc oxide mesomorphic microspheres and the nano-metal particles are mixed evenly, so that a strong local electric field is generated a few nanometers nearby a surface of the nano-metal particle by taking advantage of the surface-enhanced Raman scattering effect (SERS) of the nano-metal particles, a nanocantilever of the ZnO mesomorphic microsphere is greatly changed in polarizability with ample contact of the nano-metal particles and the ZnO mesomorphic microspheres, and thus the terahertz radiation power thereof is enhanced;

3. the embodiments herein realize working at room temperature, long-wavelength radiation, and higher power and conversion efficiency integrally; and 4. the experiments required by the embodiments herein are simple and feasible, employ cheap and non-toxic materials, and are easy to be popularized.

The THz laser device provided herein has the characteristics of long wavelength, high power, a compact structure, and capability of working at room temperature. Micro THz laser devices will find application in many fields, such as 6G communication, aerospace, security detection, and medicine, especially in microelectromechanical systems (MEMS) as an integral core device.

DESCRIPTION OF THE EMBODIMENTS

Figure 1:
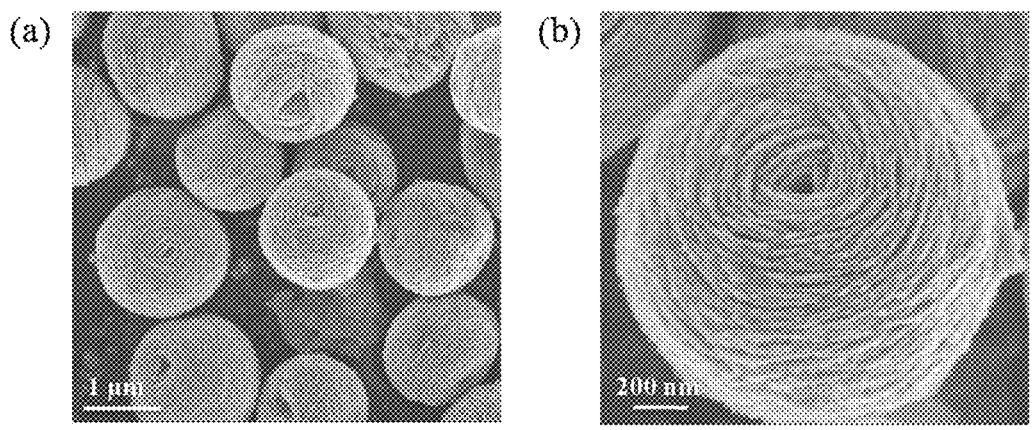
FIG. 1 is a scanning electron micrograph of zinc oxide mesomorphic microspheres in an embodiment of the present disclosure.

At first, the inventors explored the radiation mechanism, a ZnO mesomorphic microsphere is used as a source, a symmetric stretching vibration of zinc oxide nanosheets is excited and induced by a laser, propagates through the elastic and electrical coupling among nanosheets, and radiates terahertz waves with a frequency of 0.36 THz outwards by means of phonon vibration. Working at room temperature and long-wavelength radiation are accomplished at the same time. In principle, the laser device herein has a wavelength range from a full range of visible spectrum to ultraviolet wavelengths.

Because the energy gap of ZnO is about 3.37 eV at room temperature, if a selected laser has a wavelength (about 368 nm) in the vicinity of the energy gap, the laser will cause resonance Raman scattering with the ZnO microspheres and produces a Raman intensity enhancement of more than 4 orders of magnitude, thereby generating a stronger terahertz signal through radiation. Therefore, in terms of exciting the ZnO microspheres to radiate the terahertz signal, the excitation effect enhances gradually from red light to purple light for the laser device, and the purple light has the best excitation effect. However, excitation with the purple light may generate a certain degree of background noise on the support layer, so an argon ion laser device with a wavelength of 514.5 nm (green laser) is adopted as an excitation source in the implementation of the present disclosure with various factors fully considered.

To improve the energy conversion efficiency of the device, besides taking advantage of terahertz radiation excited by ZnO mesomorphic microspheres under direct laser irradiation, the ZnO mesomorphic microspheres and the nano-metal particles are evenly mixed, so that a strong local electric field is generated a few nanometers nearby a surface of the nano-metal particles by taking advantage of a surface-enhanced Raman effect (SERS) of the nano-metal particles, a nanocantilever of the ZnO mesomorphic microsphere is greatly changed in polarizability with ample contact of the nano-metal particles and the ZnO mesomorphic microspheres, and thus the terahertz radiation power thereof is enhanced. Besides, a diameter ratio of the ZnO mesomorphic microsphere to the nano-metal particle is controlled to be approximately 200:1 to 600:1. A significant difference between the sizes of the ZnO mesomorphic microsphere and the nano-metal particle means that more nano-metal particles can be in contact with the surface of each ZnO mesomorphic microsphere on average, so that the ZnO mesomorphic microspheres have an enlarged total surface area in contact with the nano-metal particles, and the effect of enhancing the terahertz radiation by taking advantage of the surface-enhanced Raman effect of the nano-metal particles is further improved.

In addition, the ZnO mesomorphic microspheres and the nano-metal particles are compounded in a hollow waveguide through a binder, and a nano-Ag reflection-enhancing film is provided on an outer layer. Herein, the nano-Ag reflection-enhancing film can enable a laser to be reflected in a cavity, the laser directly interacts with the ZnO mesomorphic microsphere repeatedly and excites terahertz radiation, and at the same time, the terahertz radiation of the ZnO mesomorphic microsphere is multiplied by repeating the surface-enhanced Raman effect of the nano-metal particles, making efficient use of the energy of the laser and achieving a continuous enhancement effect. Moreover, the nano-Ag reflection-enhancing film can also reduce the loss of the terahertz wave excited from the ZnO mesomorphic microsphere in the waveguide, so that the reflected terahertz wave can be effectively utilized. Optical lenses are provided at the front and rear ends, and a resonant cavity is formed through a dimensional design to let the laser be incident obliquely into the waveguide. According to such a design, the laser can go back and forth in the resonant cavity for excitation, which improves the efficiency, and the resonance of the terahertz signal is enhanced. Unless specifically illustrated otherwise, all the lenses in the embodiments herein are optical lenses.

As described in this application, a method for preparing a hollow waveguide of a terahertz laser device based on phonon vibration excitation, including the steps of:

(1) preparing a flexible support layer on a silicon wafer substrate through spin coating;

(2) thoroughly mixing the ZnO mesomorphic microspheres and the nano-metal particles, then dissolving the mixture and a binder in an organic solvent, ultrasonically oscillating to obtain a suspension, spin-coating the suspension on the flexible support layer, and drying at a constant temperature of 60° C. to obtain an evenly distributed ZnO-M film; and (3) peeling the above mixed film from the substrate to obtain a flexible support layer/ZnO-M film, namely, to obtain the mixed film composed of the flexible support layer and the ZnO-M film formed on the flexible support layer; placing the flexible support layer in the flexible support layer/ZnO-M film with one surface facing upwards, and plating a nano-Ag film (i.e., the nano-Ag reflection-enhancing film) on the surface through magnetron sputtering to obtain a composite film; folding the composite film into a hollow waveguide with the ZnO-M film as an inner layer, placing optical lenses at both ends of the waveguide to obtain a resonant cavity of a certain size, letting a laser be incident into the waveguide obliquely at a certain angle, and detecting a resonance-enhanced terahertz signal by using a Golay cell detector.

Unless specifically illustrated otherwise, the composite film in each embodiment herein refers to an Ag/flexible support layer/ZnO-M composite film, that is, a film composed of a ZnO mesomorphic microsphere-nano-metal particle film layer, a flexible support layer, and a nano-Ag reflection-enhancing film layer, wherein ZnO-M refers to a mixture of the ZnO mesomorphic microspheres and the nano-metal particles, the ZnO mesomorphic microsphere-nano-metal particle film layer is a ZnO mesomorphic microsphere-nano-metal particle film, the Ag reflection-enhancing film layer is an Ag reflection-enhancing film, namely, the ZnO mesomorphic microsphere-nano-metal particle film is composed of the ZnO mesomorphic microspheres and the nano-metal particles, and the nano-Ag reflection-enhancing film is composed of Ag.

A PMMA sheet is used as a lens on a side where the laser is incident, i.e., the input end of the waveguide, and it can transmit more than 92% of the visible spectrum and reflect most of the terahertz signals generated inside the waveguide. A side from which the terahertz signal is output, i.e., the output end of the waveguide, uses a terahertz bandpass filter which can reflect most of the incident laser and transmit terahertz signals. According to such a design, the ZnO microsphere can be repeatedly excited by the laser in the resonant cavity to improve the efficiency of terahertz excitation, and the terahertz signal is subjected to resonance enhancement.

As for the design rule, an inner diameter of the waveguide of the resonant cavity is greater than the wavelength of the terahertz signal by 0.833 mm (0.36 THz). The terahertz wave starts from a point in the cavity and returns to the point after one round trip in the cavity, in phase with an initial wave (with a phase difference being integral multiples of $2\pi$), so that the resonance enhancement can be enabled.

Let the length of the resonant cavity be L, the terahertz wavelength is $\lambda=0.833$ mm, and n is a positive integer, then the constructive interference condition is:

$$\Delta\Phi=2\pi/\lambda 2L=2\pi n$$

By substituting values into the above equation, we have:

$$L=0.416n \text{ mm.}$$

Let n be 50, the length L is then 20.8 mm. An argon ion laser device with a 514.5 nm wavelength is taken as the excitation source, a laser is incident into the waveguide through the PMMA sheet, and the terahertz signal can be detected at the output end of the waveguide to increase linearly with the incident power. Changing the angle of incidence of the laser can also change the conversion efficiency. When the angle between the incident direction and a wall of the waveguide is 30 degrees, about 0.124% of the incident power is converted into terahertz radiation, and when the incident direction is parallel to the wall of the waveguide, the conversion efficiency is reduced to 0.083%.

The core concept of terahertz laser device prepared through the above design method is to provide the terahertz source based on phonon vibration and the resonant cavity thereof, by which long-wavelength terahertz radiation at room temperature can be realized. The ZnO mesomorphic microsphere, as the terahertz source, is easy to manufacture with feasible operation condition; a terahertz signal with the frequency of 0.36 THz can be detected just by the oblique incidence of a laser.

Further, to obtain the high-power terahertz signal radiation, the waveguide and the resonant cavity are optimized herein. The flexible support layer (PI film) prepared through spin coating has excellent flexibility, stability and dielectric properties, has less loss on terahertz signals, and can be used for preparing the waveguide. To compound the ZnO mesomorphic microspheres and the nano-metal particles on the surface of the flexible support layer better, PMMA powders are selected as the binder and are dissolved in trichloromethane together with the ZnO mesomorphic microspheres and the nano-metal particles (nano-Ag), and a suspension is prepared through ultrasonic oscillation. The suspension is spin-coated evenly on the flexible support layer and dried at a constant temperature of 60° C. to obtain the evenly distributed ZnO-M film (ZnO—Ag film). Herein, PMMA is colorless and transparent, can transmit 92% of the visible spectrum, and features a high reflectivity to terahertz signals. The flexible support layer/ZnO-M film can be peeled off from the silicon wafer by treating the flexible support layer/ZnO-M film with HF acid. The film is placed with a side having ZnO-M facing downwards on a magnetron sputtering substrate, and a silver film of a thickness of 191 nm is plated on a side of the flexible support layer through magnetron sputtering as the nano-Ag reflection-enhancing film to obtain the composite film. The nano-Ag reflection-enhancing film is very smooth, so it has very good reflectivity to terahertz waves, and the reflectivity to terahertz signals is thus further improved. Moreover, the nano-Ag reflection-enhancing film has good reflectivity to electromagnetic waves in the visible spectrum and can be limit the same in the resonant cavity to repeatedly excite terahertz radiation from ZnO microspheres, making full use of the incident light energy and improving the energy conversion efficiency.

Figure 3:
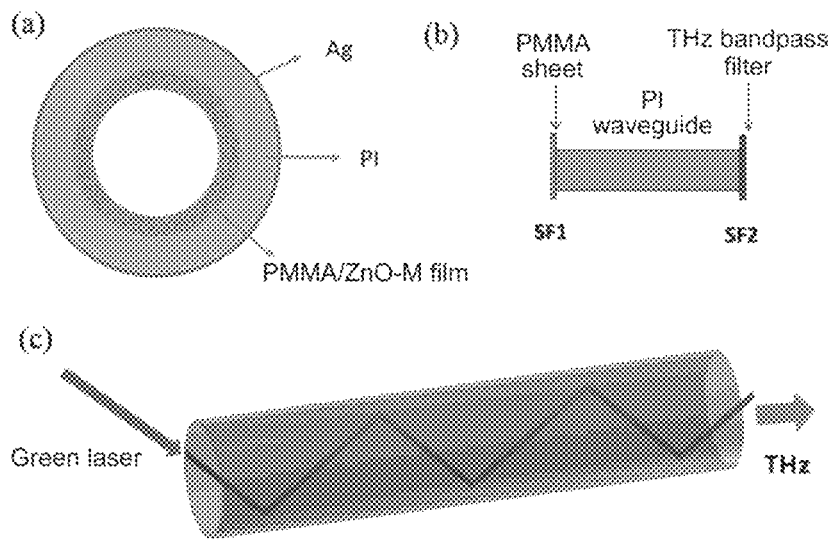
FIG. 3 is a schematic diagram of an embodiment of a process for designing a waveguide and a resonant cavity in an embodiment of the present disclosure.

FIG. 3 is a schematic diagram of an embodiment of a process for designing a waveguide and a resonant cavity in an embodiment of the present disclosure, wherein (a) is a cross-sectional schematic diagram of the hollow waveguide, (b) is a design diagram of the resonant cavity, and (c) is a schematic diagram of how the terahertz laser device works. FIG. 3(a) shows a cross-section of the hollow waveguide in which a ZnO-M film layer is provided on the inner side (as shown, the ZnO mesomorphic microspheres are thoroughly mixed with the nano-metal particles, so a certain number of nano-metal particles surround each ZnO mesomorphic microsphere), a PI film layer is in the middle, and the nano-Ag reflection-enhancing film layer is on the outermost side. FIG. 3(b) shows a structure of the resonant cavity in which the PMMA sheet and a THz bandpass filter sheet are sequentially disposed at the input end and the output end of the hollow waveguide to form the resonant cavity. The argon ion laser device with a wavelength of 514.5 nm (green laser) is used as the excitation source, the green laser is incident into the waveguide through the PMMA sheet, and the terahertz signal is detected near the output end of the waveguide by a Golay cell detector. The working principle thereof is as shown in FIG. 3(c), the green laser is incident from one end of the PMMA sheet, and the terahertz signal is outputted from the other end.

EXAMPLE

Step 1, preparation of self-assembled zinc oxide mesomorphic microspheres: 0.002 mol (0.59 g) of zinc nitrate hexahydrate, namely, Zn(NO3).6H2O, and 5 ml of sodium polystyrene sulfonate (PSS, average molecular weight MW≈100 000 g/mol, solid content: 20%) were dissolved in 30 ml of deionized water and stirred for 5 minutes. And then 0.002 mol (0.28 g) of hexamethylenetetramine (HMT) was added to the solution and stirred for another 10 minutes. The solution prepared as above was poured into a hydrothermal kettle with a 35-ml polytetrafluoroethylene as a liner, and the kettle was put into a resistance oven with its lid screwed and reacted for 3 to 10 hours at a temperature of 95° C. After completion of the reaction, the hydrothermal kettle was taken out and naturally cooled at room temperature. A supernatant clear solution in the reaction solution was removed, and then the precipitate was poured into a centrifuge tube and washed and centrifuged repeatedly with addition of deionized water and ethanol solution. The washed precipitate was placed in an oven and dried at 60° C.

It was found through characterization with scanning electron microscopy that ZnO microspheres with diameters of 1 to 5 μm were obtained by varying the reaction time at 95° C. In the example, a scanning electron microscope (SEM) of ZnO mesomorphic microspheres is shown in FIG. 1. ZnO mesomorphic microspheres having an average diameter of 1.5 μm were obtained by controlling the reaction time to be 4 hours, and the surface thereof was composed of a plenty of densely arranged nanosheets distributed radially.

Figure 2:
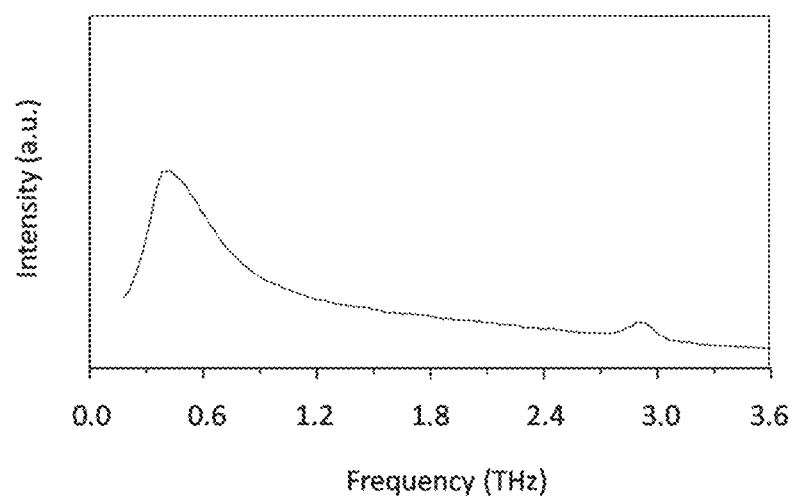
FIG. 2 is a low-frequency Raman spectrum of zinc oxide mesomorphic microspheres in an embodiment of the present disclosure.

The zinc oxide mesomorphic microspheres (514.5 nm excitation) were characterized by Raman. As shown in FIG. 2, a stronger low-frequency Raman peak was observed at 0.36 THz and a weaker low-frequency Raman peak was observed at 2.91 THz.

Figure 4:
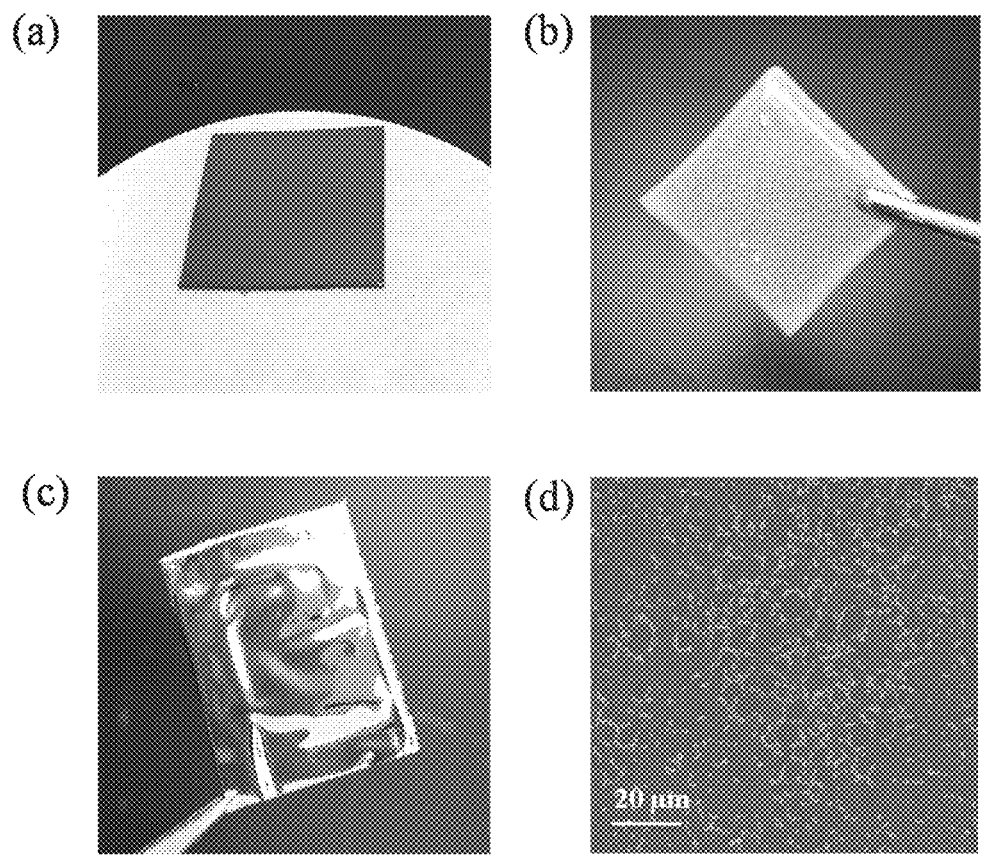
FIG. 4 is a schematic diagram of an embodiment of a process for preparing an Ag/PI/PMMA/ZnO-M film in an embodiment of the present disclosure.

Step 2, preparation of an Ag/PI/PMMA/ZnO-M waveguide: a 3 cm×3 cm silicon wafer was cut out by a diamond knife and ultrasonically cleaned with acetone, alcohol and deionized water for about 3 minutes. A sucker with a proper size is selected, and the silicon wafer was placed on the sucker of a homogenizer. A low rotating speed is set to be 500 revolutions per minute, at which the sucker rotates for 10 seconds, and a high rotating speed is set to be 1000 revolutions per minute, at which the sucker rotates for 30 seconds. A proper amount of the PI solution was dropped at the central position of the silicon wafer, and the spin coating was started. Once completed, the silicon wafer was dried on a heating table at 100° C. for 5 minutes to obtain a PI film. FIG. 4 is a schematic diagram of an embodiment in the preparation of the Ag/PI/PMMA/ZnO-M film of the present disclosure, wherein (a) is the PI film spin-coated on the silicon wafer, (b) is the PI/PMMA/ZnO-M film peeled off from the silicon wafer, and (c) is the Ag/PI/PMMA/ZnO-M film plated by silver and tailored, and (d) is a scanning electron microscope image of the PMMA/ZnO-M film layer. The resulting sample is shown in FIG. 4(a). A total of 0.025 g of the ZnO mesomorphic microspheres prepared in step 1 (with an average diameter of about 1.5 μm) was mixed with 0.086 g of nano-Ag particles (with an average diameter of about 5 nm) to obtain a mixed powder, namely, to control the diameter ratio of the ZnO mesomorphic microsphere to the nano-Ag particle to be about 300:1. A total of 0.1 g of PMMA powders were dissolved in 1 ml of trichloromethane, the mixed powder of the ZnO mesomorphic microspheres and the nano-Ag particles was added, a suspension is prepared through ultrasonic oscillation, which was spin-coated on the PI film, rotated at 20 revolutions per minute for 15 seconds, and then dried at a constant temperature of 60° C. for 12 hours; PMMA is of a mesh structure, and the ZnO microspheres and the nano-Ag particles were secured on the PI film. The finally obtained PI/PMMA/ZnO—Ag film can be peeled off from the silicon wafer by soaking it in an HF solution, as shown in FIG. 4(b). The morphology of the ZnO—Ag film layer is shown as FIG. 4(d), PMMA is form as a mesh-like shape, and the ZnO microspheres and the nano-Ag particles are evenly distributed on the surface of the PMMA. After the PI/PMMA/ZnO—Ag film was cleaned and dried, the PI/PMMA/ZnO—Ag film was secured on a sample holder of a magnetron sputtering device, a reaction chamber was firstly vacuumized to an ultimate pressure, i.e., $5\times10^{-4}$ Pa, then a high-purity argon gas (99.99%) was filled in as a reaction gas, a high-purity Ag target material (99.99%) was employed, and the rotation speed of the sample holder was set to be 20 revolutions per minute to prepare the nano-Ag reflection-enhancing film on a side of the PI film without zinc oxide through RF sputtering. As shown in FIG. 4(c), the nano-Ag plating film is evenly distributed. The Ag/PI/PMMA/ZnO—Ag film was cut into 3 cm×2.08 cm, and folded into a hollow cylindrical waveguide having a length of 2.08 cm (i.e., a length of the cavity when n=50) with the ZnO side facing inwards, and the PMMA sheet and terahertz bandpass filter were placed at the input and output ends of the waveguide sequentially to form the resonant cavity.

Figure 5:
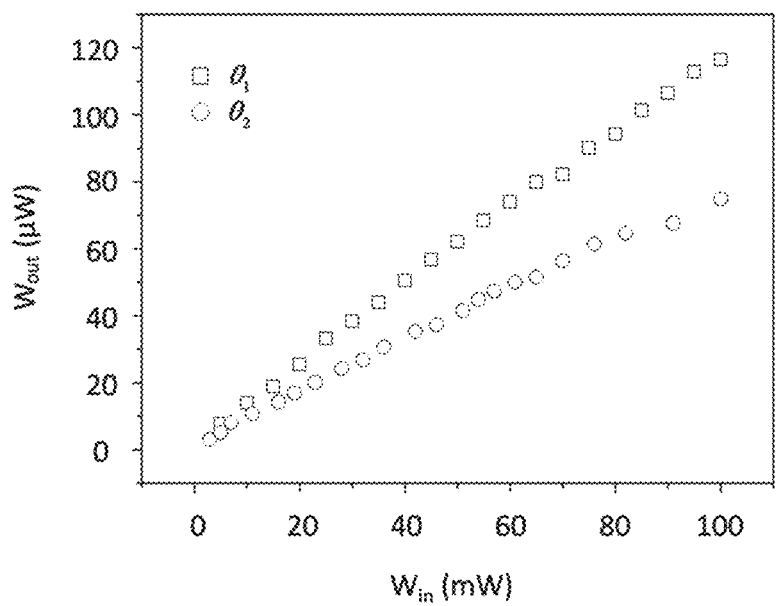
FIG. 5 shows an output power of a terahertz signal as a function of input power and an angle in an embodiment of the present disclosure.

The green laser could repeat the excitation in the resonant cavity, and the terahertz signal was subjected to resonance enhancement. The input power of the green laser was increased from 3 mW to 100 mW, the incident angle of the green laser was changed, and a Golay cell was placed 1 cm away from the terahertz signal output end to detect the power of the terahertz wave. The result is shown in FIG. 5, as the input power of the green laser was increased from 3 mW to 100 mW, the terahertz output power linearly increased with the input power of the green laser. Herein, the square in FIG. 5 represents that the angle between the incident direction of the green laser and a wall of the waveguide was 30 degrees, the terahertz output power increased from 7.8 µW to 116.5 µW, and about 0.124% of the incident power was converted into terahertz radiation; the circle in FIG. 5 represents that the angle between the incident direction of the green laser and a wall of the waveguide was 0, the terahertz output power increased from 3.1 µW to 74.9 µW, and approximately 0.083% of the incident power was converted to terahertz radiation. A THz laser device of such a structure is novel and achieves a considerable power conversion efficiency.

In summary, the terahertz laser device based on zinc oxide phonon vibration optically excited at room temperature provided herein realizes working at room temperature, long-wavelength radiation, and higher power and conversion efficiency at the same time. Further, the experiment condition required by the embodiments herein are simple and feasible, and it employs cheap and non-toxic materials, and is easy to popularize.

What is claimed is:

1. A terahertz laser device based on phonon vibration excitation, comprising a resonant cavity, the resonant cavity being composed of a hollow waveguide made of a composite film and optical lenses at both ends of the waveguide;
wherein the composite film comprises a ZnO mesomorphic microsphere-nano-metal particle film layer, a flexible support layer, and a nano-Ag reflection-enhancing film layer which are sequentially connected, the ZnO mesomorphic microsphere-nano-metal particle film layer is formed by a mixture of ZnO mesomorphic microspheres and nano-metal particles.

2. The terahertz laser device according to claim 1, wherein the ZnO mesomorphic microsphere-nano-metal particle film layer is formed by the mixture secured on the flexible support layer through a binder.

3. The terahertz laser device according to claim 1, wherein the ZnO mesomorphic microsphere-nano-metal particle film layer is obtained by securing a suspension, which is obtainable by dissolving the mixture and the binder in an organic solvent and ultrasonically oscillating the same, on the flexible support layer by spin coating.

4. The terahertz laser device according to claim 1, wherein the ZnO mesomorphic microsphere-nano-metal particle film layer is formed by the mixture of ZnO mesomorphic microspheres and nano-metal particles secured on the flexible support layer by PMMA of a mesh structure.

5. The terahertz laser device according to claim 1, wherein an average diameter of the ZnO mesomorphic microspheres is 1 to 5 µm, and a diameter ratio of the ZnO mesomorphic microsphere to the nano-metal particle is 200:1 to 600:1.

6. The terahertz laser device according to claim 1, wherein the ZnO mesomorphic microsphere is composed of radially distributed cantilevers, and each cantilever is composed of nanosheets.

7. The terahertz laser device according to claim 1, wherein the nano-metal particle is a metal particle rendering a surface-enhanced Raman scattering effect.

8. The terahertz laser device according to claim 7, wherein the nano-metal particles are one or more of nano Au particles, nano-Ag particles, and nano Cu particles, and a size of the nano-metal particle is 5 to 15 nm.

9. The terahertz laser device according to claim 1, wherein the flexible support layer is a polyimide film obtainable through spin coating.

10. The terahertz laser device according to claim 1, wherein the nano-Ag reflection-enhancing film layer is obtained through magnetron sputtering.

11. The terahertz laser device according to claim 10, wherein the nano-Ag reflection-enhancing film layer has a thickness greater than 106 nm.

12. The terahertz laser device according to claim 1, wherein the optical lens at an input end of the waveguide is a polymethylmethacrylate sheet and the optical lens at an output end is a THz bandpass filter.

13. The terahertz laser device according to claim 1, wherein a length of the resonant cavity is L=0.416n mm, where n is a positive integer, and n ranges from 30 to 80.

14. The terahertz laser device according to claim 1, wherein an excitation source of the terahertz laser device is an argon ion laser device using a wavelength of 514.5 nm.

15. The terahertz laser device according to claim 14, wherein a laser emitted by the excitation source is incident into the waveguide through the optical lens at the input end of the waveguide, where an incident direction of the laser is at an angle of 30 degrees to a wall of the waveguide.

16. A resonant cavity of a terahertz laser device based on phonon vibration excitation, wherein the resonant cavity is composed of a hollow waveguide made of a composite film and optical lenses at both ends of the waveguide;

the composite film comprises a ZnO mesomorphic microsphere-nano-metal particle film layer, a flexible support layer, and a nano-Ag reflection-enhancing film layer which are sequentially connected, the ZnO mesomorphic microsphere-nano-metal particle film layer is formed by a mixture of ZnO mesomorphic microspheres and nano-metal particles.

17. A hollow waveguide of a terahertz laser device based on phonon vibration excitation, wherein the hollow waveguide is a hollow structure made of a composite film, the composite film comprises a ZnO mesomorphic microsphere-nano-metal particle film layer, a flexible support layer, and a nano-Ag reflection-enhancing film layer which are sequentially connected, the ZnO mesomorphic microsphere-nano-metal particle film layer is formed by a mixture of ZnO mesomorphic microspheres and nano-metal particles.

\* \* \* \* \*